(12) United States Patent
Sato

(10) Patent No.: US 8,384,878 B2
(45) Date of Patent: Feb. 26, 2013

(54) EXPOSURE APPARATUS AND DEVICE MANUFACTURING METHOD

(75) Inventor: Hiroshi Sato, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 594 days.

(21) Appl. No.: 12/579,218

(22) Filed: Oct. 14, 2009

(65) Prior Publication Data

US 2010/0097595 A1   Apr. 22, 2010

(30) Foreign Application Priority Data

Oct. 16, 2008   (JP) ................................. 2008-268000

(51) Int. Cl.
*G03B 27/52* (2006.01)
*G03B 27/58* (2006.01)
*G03B 27/32* (2006.01)
(52) U.S. Cl. ................ 355/55; 355/72; 355/77
(58) Field of Classification Search .................. None
See application file for complete search history.

(56) References Cited

U.S. PATENT DOCUMENTS

| 5,671,057 A * | 9/1997 | Kawai ............................ 356/399 |
| 5,783,833 A * | 7/1998 | Sugaya et al. ................. 250/548 |
| 6,426,508 B1 | 7/2002 | Kosugi et al. |
| 6,455,944 B1 * | 9/2002 | Kato et al. .................... 257/797 |
| 7,009,683 B2 * | 3/2006 | Sato ................................ 355/53 |
| 8,068,211 B2 * | 11/2011 | Kosugi .......................... 355/53 |
| 2002/0001083 A1 * | 1/2002 | Tabei ............................ 356/401 |
| 2003/0227607 A1 * | 12/2003 | Kato et al. ..................... 355/53 |
| 2008/0137052 A1 * | 6/2008 | Matsumoto .................... 355/62 |

FOREIGN PATENT DOCUMENTS

| JP | 11-135411 A | 5/1999 |
| JP | 2000-021768 A | 1/2000 |

\* cited by examiner

*Primary Examiner* — Toan Ton
*Assistant Examiner* — Michelle Iacoletti
(74) *Attorney, Agent, or Firm* — Canon U.S.A., Inc. IP Division

(57) ABSTRACT

An apparatus includes a stage configured to move a substrate, an optical system configured to project an image of a pattern on an original onto the substrate, an alignment detection system configured to detect an image of an alignment mark formed on the substrate and measure a position of the alignment mark, and a focus detection system having an index mark and configured to measure a height of the substrate by projecting an image of the index mark onto the substrate. The stage includes an alignment measurement mark and a focus measurement mark that has a positional relationship with the alignment measurement mark. The alignment detection system measures a position of the alignment measurement mark. The focus detection system measures a position of the image of the index mark by projecting the image of the index mark onto the focus measurement mark.

12 Claims, 12 Drawing Sheets

EXPOSURE APPARATUS AND DEVICE MANUFACTURING METHOD

BACKGROUND OF THE INVENTION

1. Field of the Invention

The present invention relates to an apparatus and a device manufacturing method.

2. Description of the Related Art

To manufacture devices (e.g., a semiconductor integrated circuit device and a liquid crystal display device), an exposure apparatus of a static exposure type, such as a stepper, and an exposure apparatus of a scanning exposure type, such as a step-and-scan exposure apparatus, are used.

FIG. 13 shows the configuration of an exposure apparatus of the related art. An illumination optical system IL illuminates a reticle RT serving as an original with light from an exposure light source LS. The reticle RT is provided with a fine circuit pattern to be transferred. An image of the pattern is projected onto a wafer W by a projection optical system PO.

The projection optical system PO is to have as large a resolving power as possible. To increase the resolving power, the numerical aperture of the projection optical system PO is set to be high, and as a result, the depth of focus of the projection optical system PO is considerably small. For this reason, the height of a surface of the wafer W is measured by a focus detection system FS using an oblique incidence detection method, and the wafer W is moved so that the surface of the wafer W coincides with the focal point of the projection optical system PO, as disclosed in Japanese Patent Laid-Open No. 2000-21768.

With improvement in resolving power, there is a demand to increase the alignment accuracy. For that purpose, an alignment mark on the wafer W is observed at a plurality of positions with an alignment detection system OA provided outside the optical axis of the projection optical system PO, whereby the position of the alignment mark in a plane perpendicular to the optical axis of the projection optical system PO is measured. In this case, there is a distance between the optical axis of the projection optical system PO and the optical axis of the alignment detection system OA. The distance is referred to as a base line amount. If the base line amount changes, when the wafer W is moved below the projection optical system PO after the alignment mark is measured with the alignment detection system OA, an error is caused. Accordingly, the change in the base line amount is measured and corrected by a TTL calibration system (not shown). This realizes more accurate and stable alignment.

The focus detection system FS projects an image of an index mark provided therein onto the wafer W, refocuses the image reflected by the wafer W onto a light receiving sensor, and measures the height of the surface of the wafer W on the basis of the change in the imaging position on the light receiving sensor. The focus detection system FS itself cannot check the position of the image of the index mark on the wafer W.

The focus detection system FS uses a light source that generates light with a plurality of wavelengths (broadband wavelengths). In the focus detection system FS, therefore, the imaging position of the index mark may differ according to the wavelength because of the differences in refractive index of the lens of the optical system for the wavelengths (chromatic aberration).

Further, the imaging position of the index mark may deviate from the designed position because of aberration remaining in the optical system of the focus detection system FS and an installation error of the focus detection system FS.

In the exposure apparatus, the positions of points (positions in the xy-direction) on the wafer in a plane perpendicular to the optical axis of the projection optical system PO are measured by the alignment detection system OA, and the surface height (position in the z-direction) of each point on the wafer are measured by the focus detection system FS.

If the position of the image of the index mark deviates from the designed position, the position in the xy-direction measured by the alignment detection system OA does not coincide with the position in the xy-direction on the wafer W whose surface height is measured by the focus detection system FS.

For this reason, even when the wafer W is moved directly below the projection optical system PO on the basis of the position in the xy-direction measured by the alignment detection system OA and the surface of the wafer W is driven to the focal position of the projection optical system PO on the basis of the surface height measured by the focus detection system FS, in actuality, the wafer W is not exposed at the focal position, but is exposed at a defocused position. This may worsen exposure performance.

SUMMARY OF THE INVENTION

An apparatus according to an aspect of the present invention includes a stage configured to move a substrate; an optical system configured to project an image of a pattern on an original onto the substrate; an alignment detection system configured to detect an image of an alignment mark formed on the substrate and measure a position of the alignment mark; and a focus detection system configured to measure a height of the substrate by projecting an image of an index mark onto the substrate. The stage includes an alignment measurement mark and a focus measurement mark that has a positional relationship with the alignment measurement mark. The alignment detection system measures a position of the alignment measurement mark. The focus detection system measures a position of the image of the index mark by projecting the image of the index mark onto the focus measurement mark.

Further features of the present invention will become apparent from the following description of exemplary embodiments with reference to the attached drawings.

DESCRIPTION OF THE EMBODIMENTS

Embodiments of the present invention will be described below with reference to the attached drawings.

Figure 1:
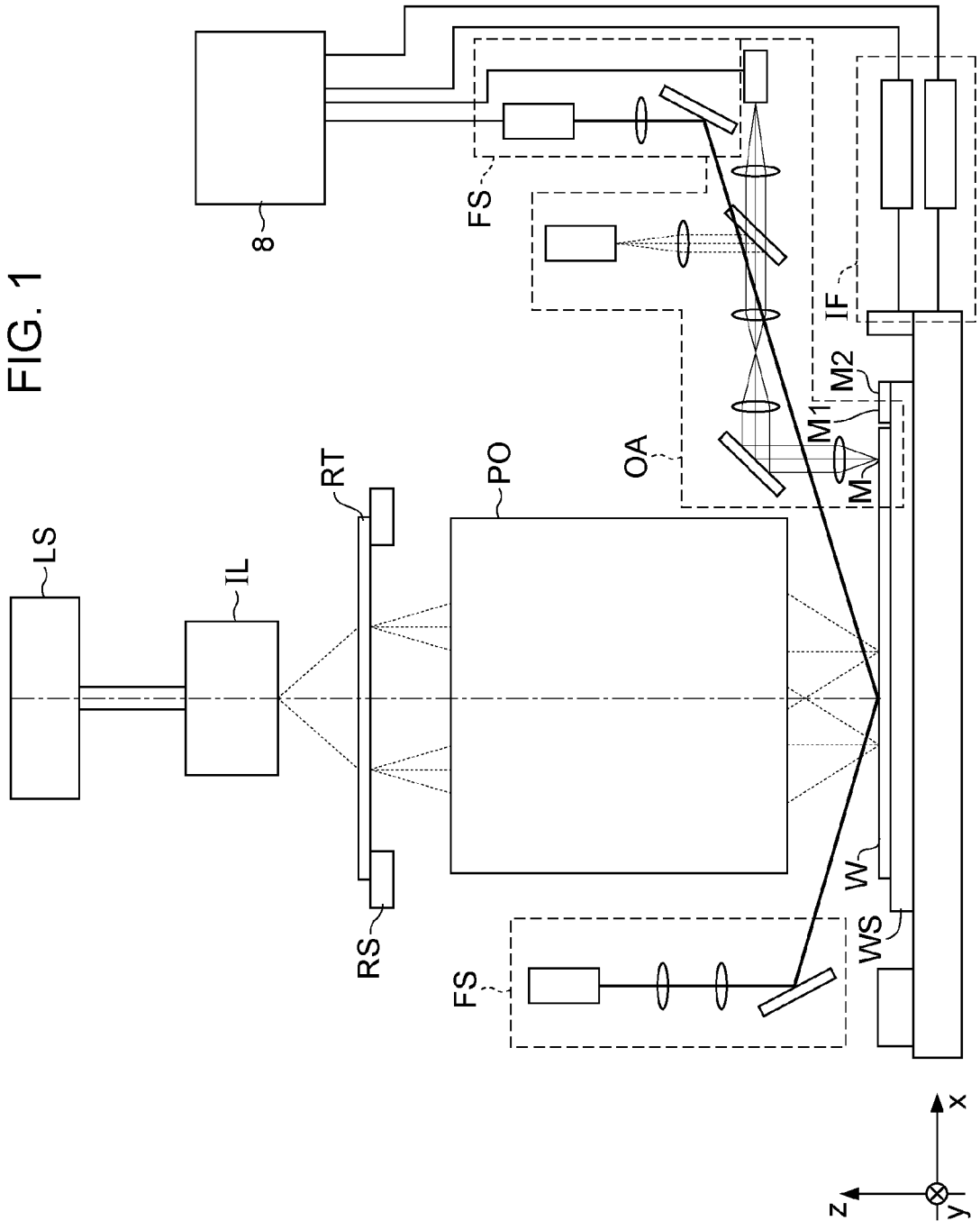
FIG. 1 is a structural view of an exposure apparatus according to a first embodiment of the present invention.

An exposure apparatus according to a first embodiment of the present invention will be described below with reference to FIG. 1.

The exposure apparatus of the first embodiment projects a circuit pattern of a reticle RT onto a wafer W mounted on a wafer stage WS by exposure via a projection optical system PO.

A light source LS is a KrF excimer laser or an ArF excimer laser, and emits ultraviolet light. A reticle stage RS moves a reticle (original) RT, and a wafer stage WS moves a wafer (substrate) W. An illumination optical system IL illuminates the reticle RT with ultraviolet light emitted from the light source LS. A projection optical system PO projects a pattern image of the reticle RT onto the wafer W.

An alignment detection system OA is provided outside the optical axis of the projection optical system PO. The alignment detection system OA optically detects an alignment mark M provided on the wafer W, and measures the position of the wafer W. In the first embodiment, the alignment detection system OA also detects an alignment-detection-system measurement mark M1 provided on the wafer stage WS. A focus detection system FS measures the height of a surface of the wafer W by an oblique incident detection method. In the first embodiment, the focus detection system FS optically detects a focus-detection-system measurement mark M2 provided on the wafer stage WS. Thus, the wafer stage WS has the alignment-detection-system measurement mark M1, and the focus-detection-system measurement mark M2 having a known relative positional relationship with the alignment-detection-system measurement mark M1.

The alignment detection system OA is provided separate from the focus detection system FS, and optically detects the alignment mark M on the wafer W without using the projection optical system PO. Since the alignment detection system OA performs detection without using the projection optical system PO, it has few optical limitations and therefore can achieve more accurate detection than when detection is performed using the projection optical system PO. The wafer stage WS can move in a plane perpendicular to the optical axis of the projection optical system PO, and the position of the wafer stage WS is measured by a position detecting interferometer IF. The wafer stage WS is driven so that the alignment mark M on the wafer W is present within a detection range of the alignment detection system OA, and the position of the alignment mark M is then measured by the alignment detection system OA.

Figure 2:
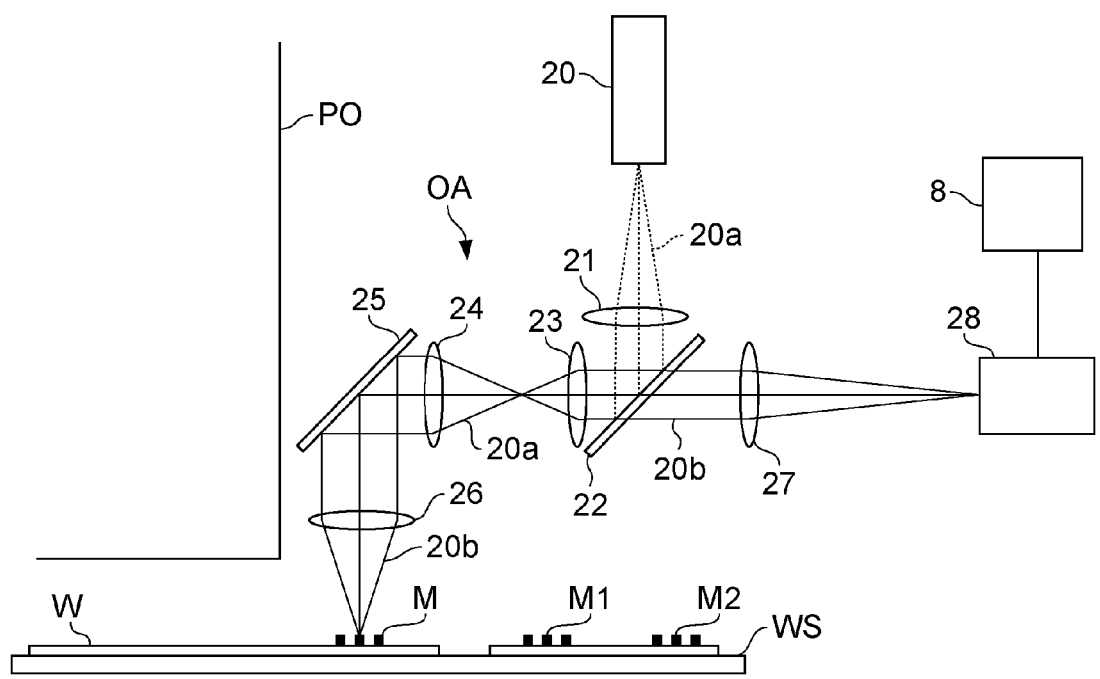
FIG. 2 is a structural view of an alignment detection system in the first embodiment.

Next, the alignment detection system OA of the first embodiment will be described in detail with reference to FIG. 2.

The alignment detection system OA includes an illumination light source 20, for example, which emits broadband wavelength light from a halogen lamp or monochromatic light from a He—Ne laser. Illumination light 20a emitted from the illumination light source 20 passes through an illumination system lens 21, is reflected by a half mirror 22, and enters a front lens unit 23 of an imaging lens system. Then, the illumination light 20a passes through a relay lens 24, is reflected by a reflecting mirror 25, and enters an objective lens 26. The illumination light 20a collected by the objective lens 26 illuminates the alignment mark M on the wafer W that is moved into the detection range of the alignment detection system OA by driving the wafer stage WS on the basis of the detection result of the position detecting interferometer IF.

Reflected scattering light 20b from the alignment mark M passes through the objective lens 26, is reflected by the reflecting mirror 25, and enters the relay lens 24. Then, the reflected scattering light 20b passes through the front lens unit 23 of the imaging lens system and the half mirror 22, is collected by a rear lens unit 27 of the imaging lens system, and forms an image of the alignment mark M on an image pickup device 28 such as a CCD. An imaging signal of the image of the alignment mark M formed on the image pickup device 28 is transmitted to a signal processing system 8 for processing, whereby the position in the xy-direction of the alignment mark M on the wafer W is detected. Also, the position in the xy-direction of the alignment mark M is calculated on the basis of information from the position detecting interferometer IF. According to the calculated position in the xy-direction, the wafer W is moved by the wafer stage WS to an exposure area of the projection optical system PO, and shot regions on the wafer W are exposed sequentially.

Figure 3:
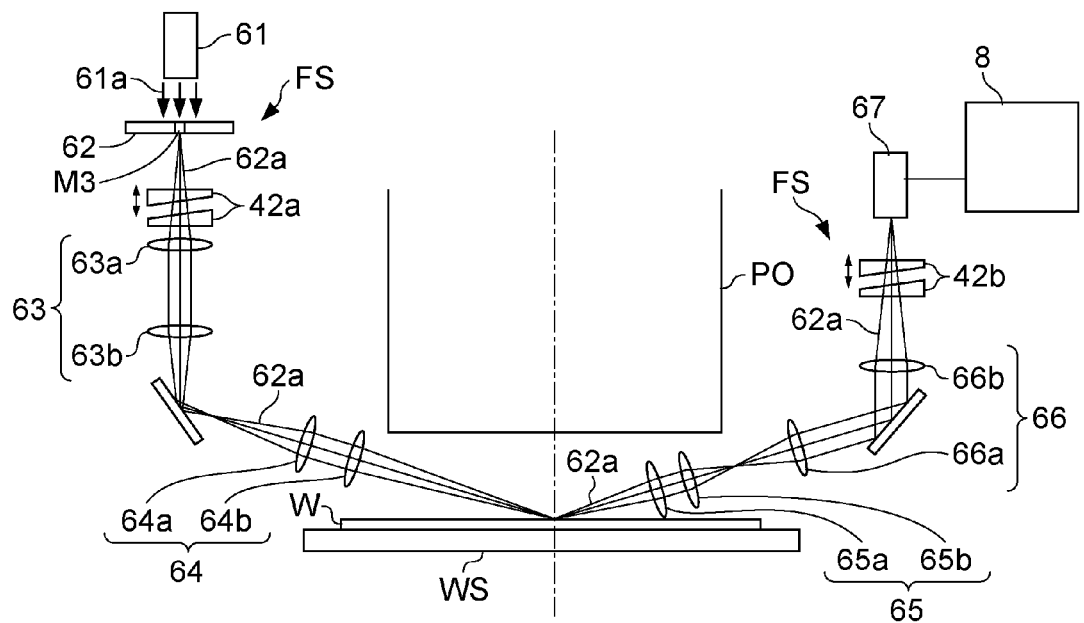
FIG. 3 is a structural view of a focus detection system in the first embodiment.

Next, the focus detection system FS of the first embodiment will be described with reference to FIGS. 1 and 3. The focus detection system FS detects the height of the surface of the wafer W. The focus detection system FS obliquely projects an image of an index mark M3 onto the surface of the wafer W. Further, the focus detection system FS detects the image of the index mark M3 with a light receiving sensor 67, and measures the height of the surface of the wafer W on the basis of the change in the imaging position.

The focus detection system FS includes a wavelength-selective illumination light source 61 using a plurality of LEDs or the like. Since the optimal detection light wavelength differs according to the condition of the wafer W, the focus detection system FS is to select and use the optimal wavelength band. Light 61a emitted from the illumination light source 61 illuminates an index mark M3 provided on a mark member 62 that constitutes the focus detection system FS. The index mark M3 is provided at a position conjugate with the wafer W, and is focused onto the wafer W. Light 62a passing through the index mark M3 of the mark member 62 enters a chromatic-aberration correcting optical member 42a. The chromatic-aberration correcting optical member 42a is formed by a plurality of wedge-shaped optical elements, and corrects chromatic aberration. Then, the light 62a passes through imaging optical systems 63 (63a, 63b) and 64 (64a, 64b) (also shown in FIG. 10), and is projected onto the wafer W.

As described above, since the index mark M3 is located in a manner such as to be conjugate with the wafer W, it is focused onto the wafer W at a predetermined magnification by the imaging optical systems 63 and 64. The light 62a passing through the index mark M3 is reflected by the surface of the wafer W, and enters imaging optical systems 65 (65a, 65b) and 66 (66a, 66b). After that, the light 62a enters a chromatic-aberration correcting optical member 42b, and is refocused onto a light receiving sensor 67 for position detection.

The light receiving sensor 67 is provided in a detecting section of the focus detection system FS corresponding to the reflected light 62a. The light receiving sensor 67 is located in a manner such that a light receiving surface thereof is substantially conjugate with the surface of the wafer W. For this reason, displacement of the surface of the wafer W in the z-direction with respect to the projection optical system PO is measured as displacement on the light receiving surface of the light receiving sensor 67. The focus detection system FS may include a plurality of light receiving sensors 67, and tilting of the wafer W may be measured by simultaneously measuring the heights of a plurality of points on the surface of the wafer W in a state in which all light receiving surfaces of the light receiving sensors 67 are substantially conjugate with the surface of the wafer W.

Figure 4:
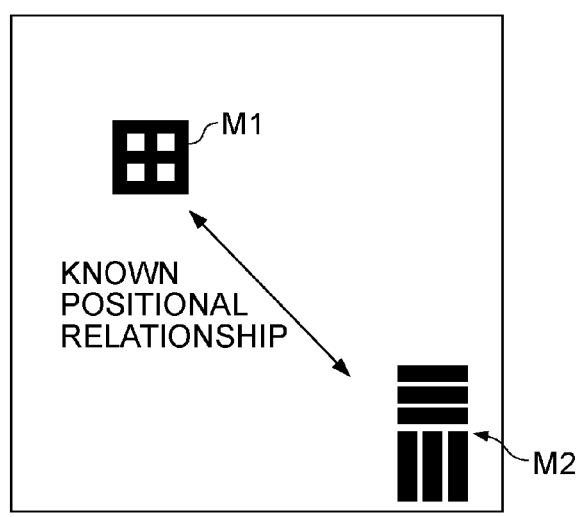
FIG. 4 is a structural view of measurement marks in the first embodiment.
Figure 5A:
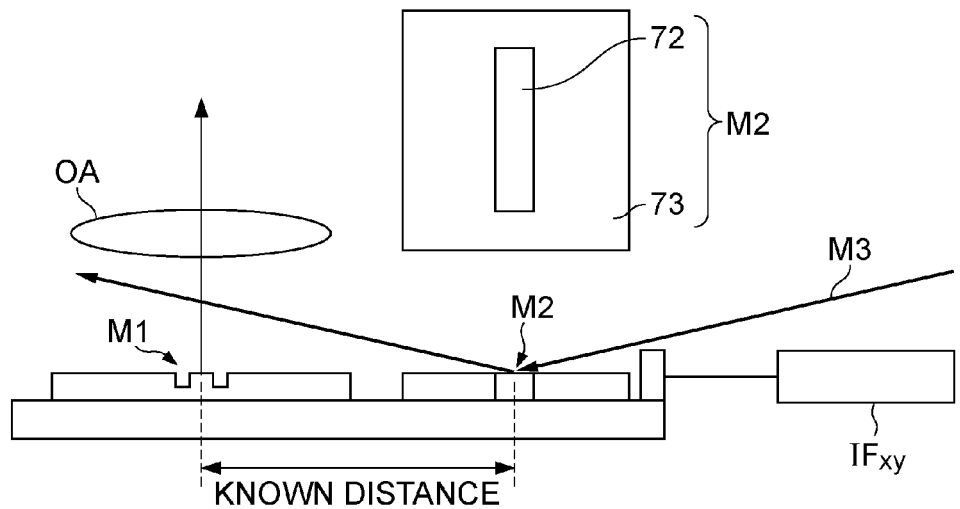
FIG. 5A is an explanatory view illustrating a method for measuring the position of an index mark in the first embodiment.

FIG. 4 is an enlarged view of the wafer stage WS and its surroundings. The focus-detection-system measurement mark M2 is provided in a peripheral portion of the wafer stage WS in a manner such as to have a known relative positional relationship with the alignment-detection-system measurement mark M1. As shown in FIG. 5A, the focus-detection-system measurement mark M2 includes a high-reflectance portion 72 having a high reflectance and a low-reflectance portion 73 having a low reflectance. On the basis of the light intensity of the image of the index mark M3 reflected by the focus-detection-system measurement mark M2, the focus detection system FS measures the position of the image of the index mark M3. The focus-detection-system measurement mark M2 is line-shaped. The longitudinal direction of the index mark M3 projected by the focus detection system FS is parallel to the longitudinal direction of the line-shaped focus-detection-system measurement mark M2. In FIG. 4, two types of marks whose measuring directions are orthogonal to each other are shown as the focus-detection-system measurement mark M2. Each of the marks is defined by three lines. In FIG. 5A, only one of the marks is simply shown by one line. The following description will be given using the simplified mark.

First, as shown in FIG. 5A, the alignment-detection-system measurement mark M1 on the wafer stage WS is measured by the alignment detection system OA, and is positioned relative to the alignment detection system OA, whereby the wafer stage WS is set at its home position.

Next, the optimal height in the z-direction of the projection image of the index mark M3 (best imaging position) is measured. This is because the index mark M3 is obliquely projected by the focus detection system FS and displacement of the height in the z-direction appears as a displacement 71 in the xy-direction (as shown in FIGS. 5B and 6B).

More specifically, the index mark M3 is projected onto a portion of the wafer stage WS where the focus-detection-system measurement mark M2 is not provided, and the light intensity of the image of the index mark M3 is measured while moving the wafer stage WS in the z-direction. At the height in the z-direction where the light intensity is the highest, the index mark M3 on the wafer stage WS is placed in the best imaging state. Since the index mark M3 is obliquely projected by the focus detection system FS, an error is caused in the position in the xy-direction by the height in the z-direction. For this reason, when being moved in the z-direction during measurement of the light intensity, the wafer stage W3 is simultaneously driven in the x- (or y-) direction, and is obliquely scanned parallel to the projection optical axis of the focus detection system FS.

After the best imaging position in the z-direction of the index mark M3 is measured, the focus-detection-system measurement mark M2 is moved in the xy-direction to the projected position of the index mark M3 while maintaining the measured position in the z-direction.

Figure 5B:
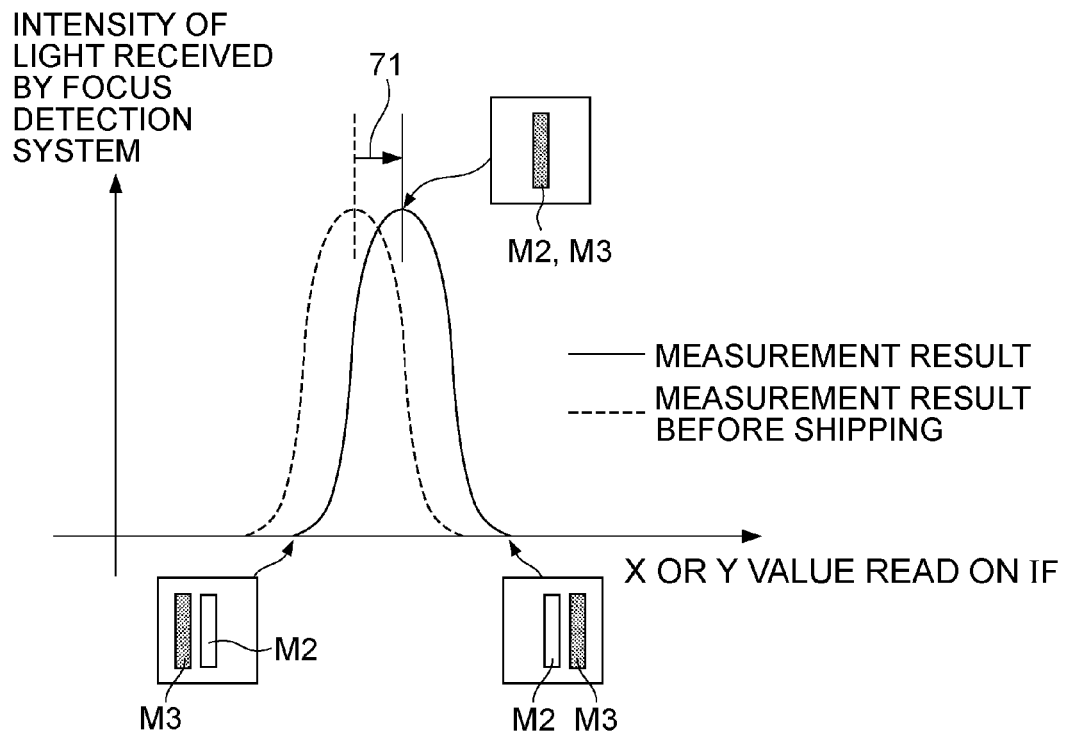
FIG. 5B is an explanatory view illustrating the method for measuring the position of the index mark in the first embodiment.

As shown in FIG. 5B, the image of the index mark M3 is projected onto the focus-detection-system measurement mark M2. The wafer stage WS is moved while measuring the position in the x- (or y-) direction with the position detecting interferometer IF so that the focus-detection-system measurement mark M2 passes on the lower side of the image of the index mark M3, and the intensity of reflected light from the focus-detection-system measurement mark M2 is measured. When the index mark M3 is projected onto the high-reflectance portion 72 of the focus-detection-system measurement mark M2, the light intensity increases. In contrast, when the index mark M3 is projected onto the low-reflectance portion 73 of the focus-detection-system measurement mark M2, the light intensity decreases.

When the relationship between the position in the x- (or y-) direction of the wafer stage WS and the light intensity is known, as shown in FIG. 5B, the peak position of the light intensity serves as the position of the image of the index mark M3. While the reflectance of the focus-detection-system measurement mark M2 is high in the first embodiment, conversely, it may be low. In this case, the bottom position of the light intensity serves as the position of the image of the index mark M3.

By performing this procedure in each of the x- and y-directions, the difference between the designed position of the image of the index mark M in the xy plane and the actual position of the image of the index mark M3 is detected. On the basis of this detection result, correction is performed. More specifically, the image of the index mark M3 is projected onto the designed position by being shifted by the difference. Alternatively, the coordinates of the position in the xy-direction corresponding to the surface height of the wafer W detected by the focus detection system FS may be corrected by the difference. Further alternatively, the position of the image of the index mark M3 may be adjusted by the method disclosed in Japanese Patent Laid-Open No. 11-135411. Such correction allows the focus detection system FS to measure the height of the surface of the wafer that is consistent with the position in the xy-direction on the wafer W measured by the alignment detection system OA.

Figure 6A:
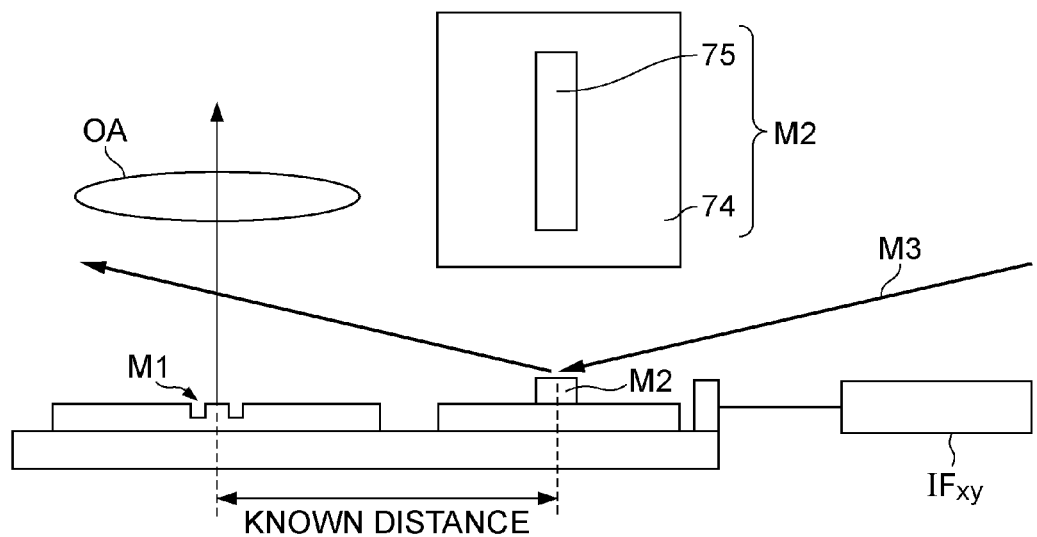
FIG. 6A is an explanatory view illustrating a method for measuring the position of an index marks in the first embodiment.
Figure 6B:
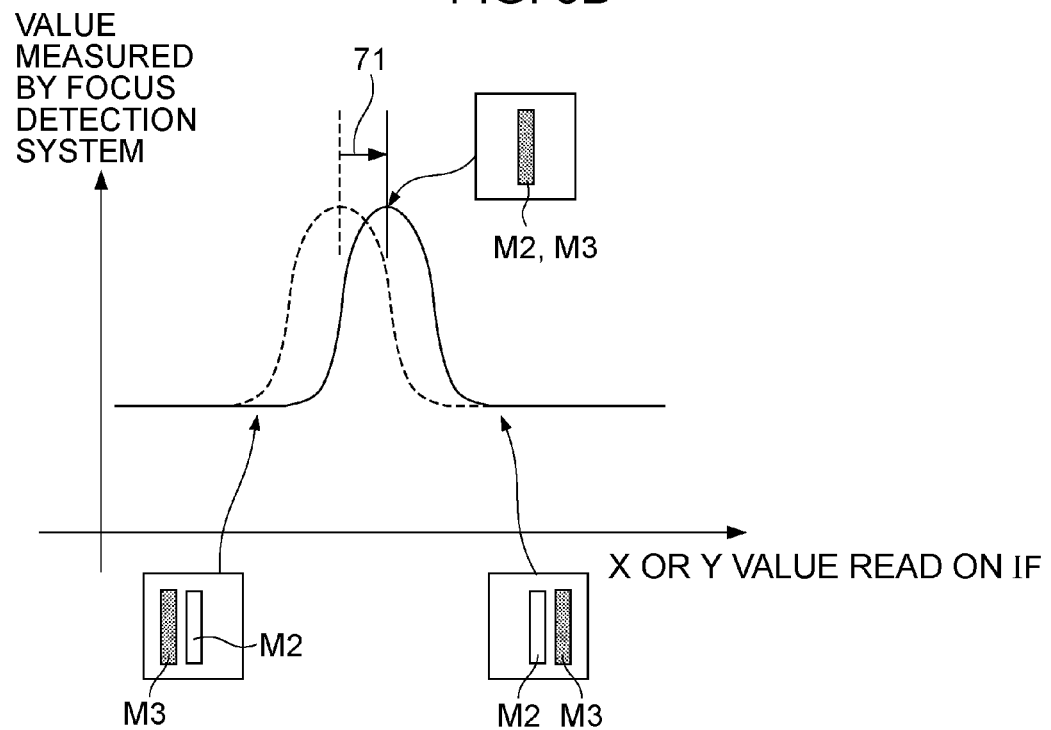
FIG. 6B is an explanatory view illustrating the method for measuring the positions of the index mark in the first embodiment.

While the focus-detection-system measurement mark M2 includes the high-reflectance portion 72 and the low-reflectance portion 73 in the first embodiment, as shown in FIG. 5A, it may include a flat face 74 and a step structure (protuberance) 75, as shown in FIG. 6A. By measuring the change in height of the focus-detection-system measurement mark M2 by the focus detection system FS, the position of the image of the index mark M3 can be measured.

While the focus-detection-system measurement mark M2 shown in FIG. 6A includes the protuberance, it may include a recess instead of the protuberance.

The focus detection system FS measures the height in the z-direction of the wafer W. Hence, in the protuberance (or recess) of the focus-detection-system measurement mark M2, the focus detection system FS can detect the peak (or bottom) different from that in the portion having no mark, as shown in FIG. 6B. This peak (or bottom) position serves as the projected position of the index mark M3. That is, when the projected position of the index mark M3 is measured using the focus-detection-system measurement mark M2, the position in the x-direction or y-direction, the height in the z-direction, and the distribution of detection light intensity are measured, and the position where the light intensity is the highest is set as the projected position of the index mark M3.

Next, a second embodiment of the present invention will be described with reference to FIGS. 7A and 7B.

In the first embodiment, the height in the z-direction of the image of the index mark M3 is first measured, and the position in the xy-direction of the image of the index mark M3 is then found. In contrast, in the second embodiment, the positions in the x-, y-, and z-directions of the image of the index mark M3 are found simultaneously. The configuration of an exposure apparatus of the second embodiment is similar to that adopted in the first embodiment.

In the second embodiment, the intensity of detection light is first acquired while driving a wafer stage WS in the x-direction (or y-direction) at a predetermined height in the z-direction.

Next, an alignment-detection-system measurement mark M1 and a focus-detection-system measurement mark M2 are slightly moved in the z-direction, and the intensity of detection light is acquired while moving the marks in the x-direction (or y-direction) again. By repeating this operation, a distribution of detection light intensities at the positions in the x-direction (or y-direction) and the heights in the z-direction can be obtained, as shown in FIGS. 7A and 7B.

Figure 7A:
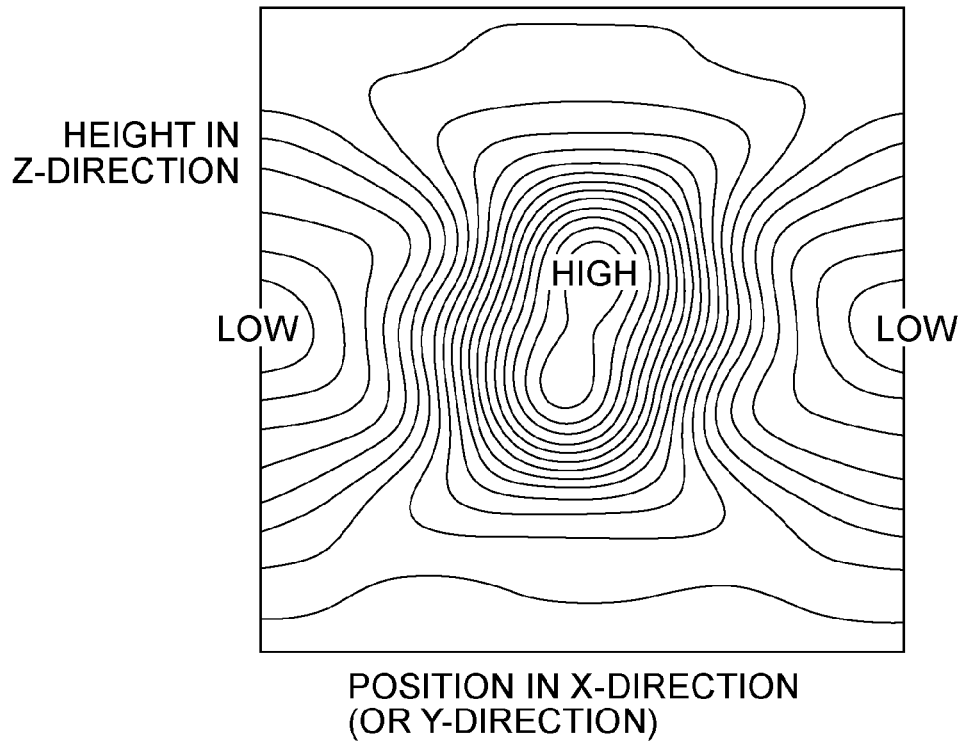
FIG. 7A shows a distribution of detection light intensity in a second embodiment of the present invention.
Figure 7B:
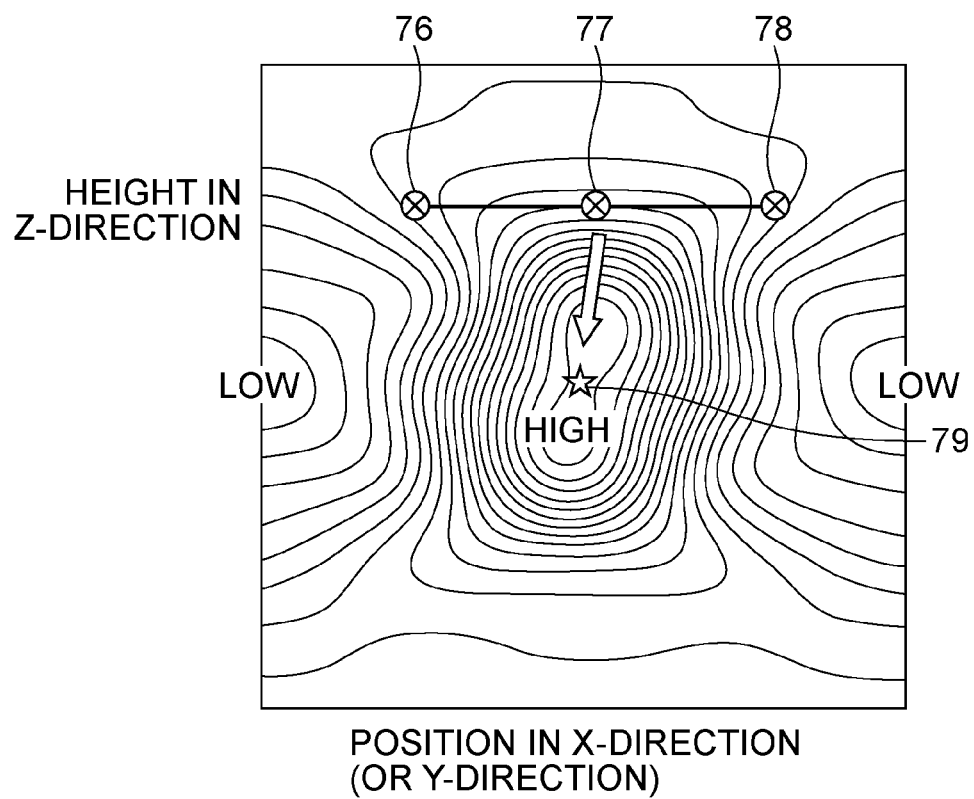
FIG. 7B shows the distribution of detection light intensity in the second embodiment.

FIG. 7A shows the measurement result of detection light intensity at the positions in the x-direction (or y-direction) and the heights in the z-direction. The distribution of signal intensity changes from the high intensity to the low intensity. Thus, the position where the detection light intensity is the highest is the position of an image of an index mark M3 in the x-, y-, and z-directions.

The detection light intensity distribution shown in FIG. 7A may be measured and stored in a memory beforehand, and the position of the image of the index mark M3 in the x-, y-, and z-directions may be estimated on the basis of the result of measurement only at several points and the stored detection light intensity distribution. This can shorten the measurement time. For example, as shown in FIG. 7B, the detection light intensity is measured at three positions 76, 77, and 78 in the x-direction at a predetermined height in the z-direction, and a position 79 where the light intensity is the highest is estimated on the basis of the relationship among the light intensities at the three positions 76, 77, and 78 and the stored detection light intensity distribution.

A third embodiment of the present invention will now be described.

When a plurality of wavelengths are used, chromatic aberration is caused by the optical factor of a focus detection system FS, and a projected position of an index mark M3 is displaced. To correct this displacement, the following method is adopted.

Chromatic aberration due to the wavelengths can be measured by performing measurement with the same exposure apparatus and in the same method as those in the first and second embodiments and detecting a difference between the wavelengths.

In the third embodiment, the difference is corrected by switching the wavelength of detection light used in the focus detection system FS. That is, displacement of the projected position of the index mark M3 is measured by switching among a plurality of detection light wavelengths used in the focus detection system FS. The measured displacement amount may be corrected by chromatic-aberration correcting optical members 42a and 42b provided in the optical system. Alternatively, the index mark M3 can be projected onto a position corrected for chromatic aberration by being projected onto a position shifted by the measured difference. Further alternatively, the coordinates of the position in the xy-direction corresponding to the surface height of the wafer W detected by the focus detection system FS may be corrected by the measured difference.

The third embodiment can accurately measure the projected position of the index mark M3, and this is effective for assembly adjustment and periodic measurement of the relative position.

A fourth embodiment of the present invention will now be described with reference to FIG. 8.

When an index mark M3 provided in a focus detection system FS is projected in a field of a detection system such as an alignment detection system OA, an imaging state and an imaging position of the index mark M3 can be measured by directly observing an image of the index mark M3 formed on a wafer W. In an exposure apparatus having two stages according to the fourth embodiment, an index mark M3 provided in a focus detection system FS is projected into the field of a detection system, such as an alignment optical system OA, as described above.

Figure 8:
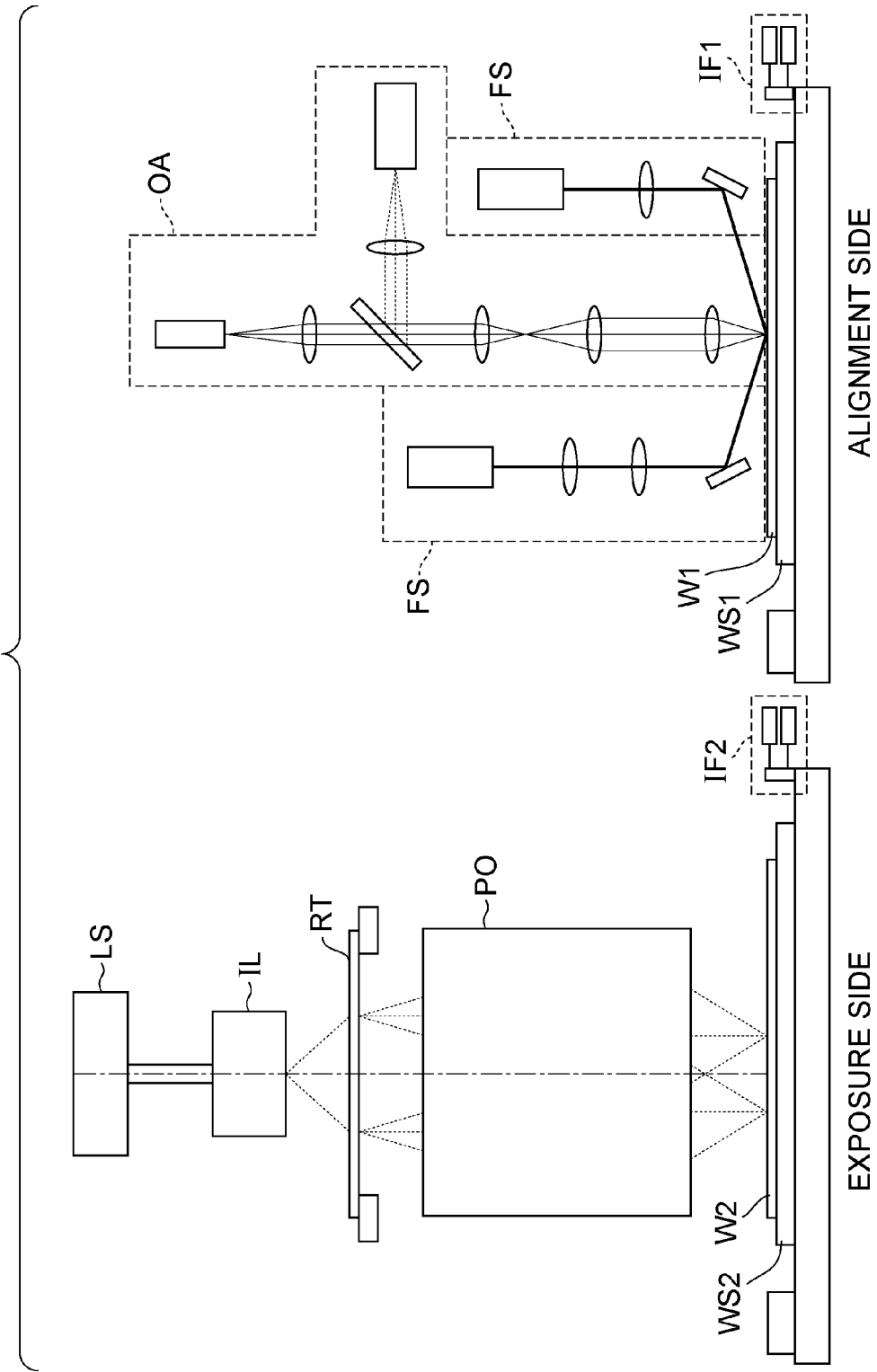
FIG. 8 is a structural view of an exposure apparatus having two stages according to a fourth embodiment of the present invention.

To improve productivity, there has recently been used an exposure apparatus including two wafer stages WS1 and WS2 that perform alignment and exposure, respectively, as shown in FIG. 8. On an exposure side, an illumination light source LS for a projection optical system PO, an illumination optical system IL for uniformly irradiating a reticle RT with illumination light, and a projection optical system PO for projecting a pattern image of the reticle RT onto a wafer W2 are provided.

On the other hand, on an alignment side, an alignment detection system OA for detecting the position of a wafer W1, and a focus detection system FS for measuring the height of a surface of the wafer W1 in the z-direction are provided. The wafer stages WS1 and WS2 are respectively provided with position detecting interferometers IF1 and IF2 for position measurement.

In the fourth embodiment, on the side of the wafer stage WS1 for alignment, the focus detection system FS serves to measure the focus of the projection optical system PO and to measure the height of the surface of the wafer W1 serving as the focal position with respect to the alignment detection system OA. To measure the height of the surface of the wafer W1 with respect to the alignment detection system OA, an index mark M3 provided in the focus detection system FS is projected into the observation field of the alignment optical system OA. By measuring the imaging position of reflected light from the projected index mark M3, the height of the surface of the wafer W1 with respect to the alignment optical system OA is found.

Figure 9:
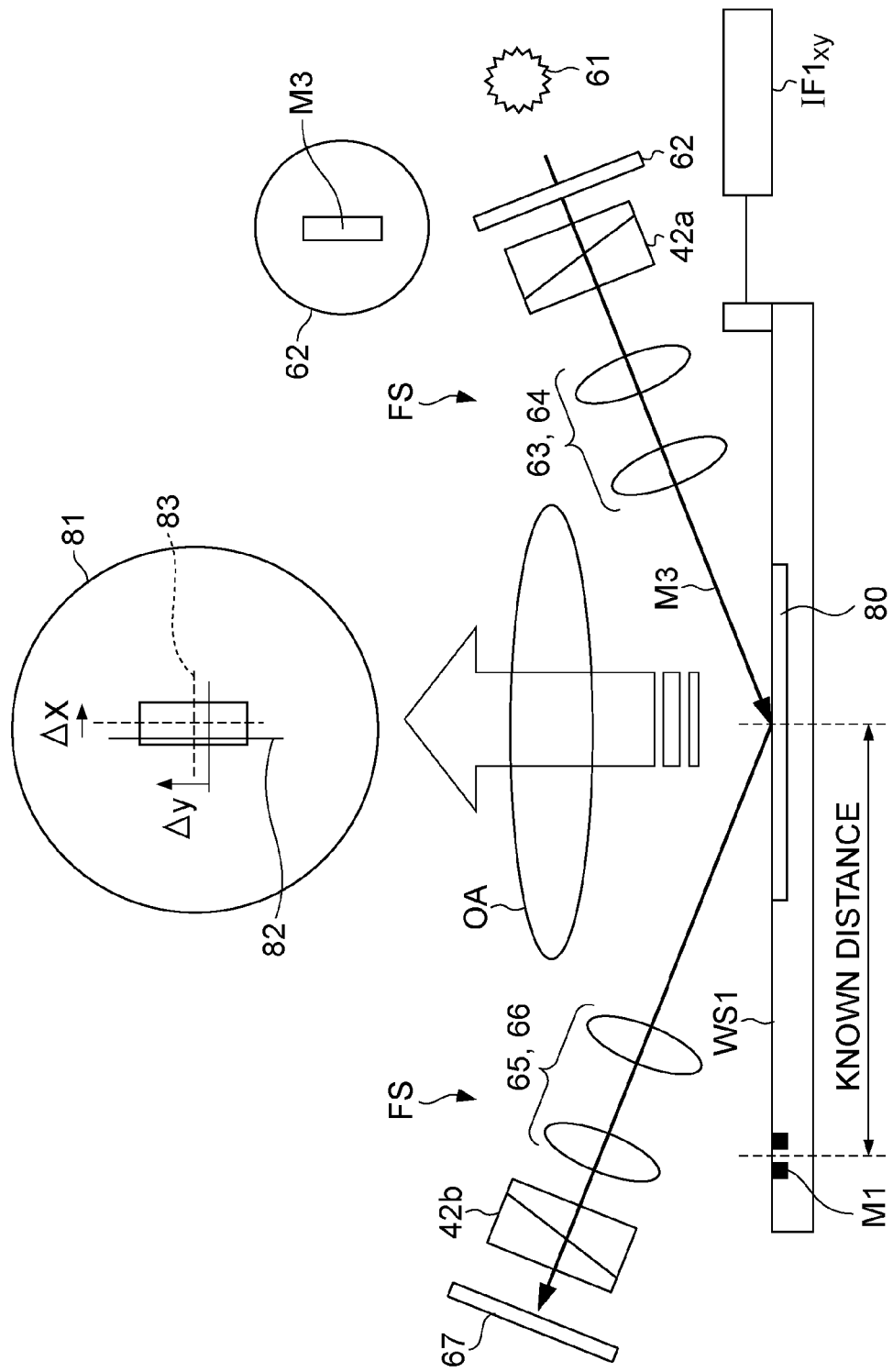
FIG. 9 is an explanatory view illustrating a method for measuring the position of an index mark in the fourth embodiment.

According to the above-described fourth embodiment, the projected position of the index mark M3 provided in the focus detection system FS is measured as follows. This measurement method will be described with reference to FIG. 9. Optical members shown in FIG. 9 are denoted by reference numerals that are common to FIGS. 1 and 3.

In the fourth embodiment, the position of the image of the index mark M3 is measured by the alignment detection system OA by observing the image of the index mark M3 with the alignment detection system OA. Further, a difference of the measured position of the image of the index mark M3 from the designed position is corrected, and the height of the surface of the wafer W1 is measured by the focus detection system FS. When the image of the index mark M3 is observed with the alignment detection system OA, a diffusing face 80 (reference portion) provided on the wafer stage WS1 is used.

First, the diffusing face 80 where light is diffusely reflected is prepared on the wafer stage WS1 on the alignment side. The wafer stage WS1 is moved so that the diffusing face 80 comes into an observation field 81 of the alignment detection system OA. The alignment-detection-system measurement mark M1 may be measured by the alignment detection system OA, and the wafer stage WS1 may be moved by a known distance on the basis of the detection result of the wafer-stage position detecting interferometer IF1, or only on the basis of the coordinates. A high positioning accuracy is unnecessary because it is only to move the diffusing face 80 to the projected position of the index mark M3.

Next, the index mark M3 provided in the focus detection system FS is projected onto the diffusing face 80. Although most light is totally reflected by a normal wafer stage, since light of the index mark M3 enters the diffusing face 80, it partially turns into scattering light. For this reason, the image of the index mark M3 formed on the wafer stage WS1 can be directly observed by the alignment optical system OA.

Then, the contrast of the projected index mark M3 is measured by the alignment detection system OA while driving the wafer stage WS1 in the z-direction, and the position where the contrast is the highest and the measured focus value of the focus detection system FS are found. From the measured values, the imaging position of the index mark M3 in the z-direction, and the height of the wafer stage WS1 in the z-direction and the measurement value of the focus detection system FS in this case can be obtained.

A solid cross 82 in the observation field 81 of the alignment detection system OA shown in FIG. 9 indicates the designed projected position of the index mark M3 where the index mark M3 should be projected. In contrast, a broken cross 83 indicates a projected position of the index mark M3 measured by the above-described method, so that displacement amounts Δx and Δy can be found. By moving the wafer W1 to a position shifted from the measured position in the xy-direction by the differences on the basis of the measurement result and projecting the index mark M3 onto the wafer W1, the index mark M3 can be projected onto the designed position. Further, the projected position of the index mark M3 may be adjusted by the method disclosed in Japanese Patent Laid-Open No. 11-135411.

Figure 11:
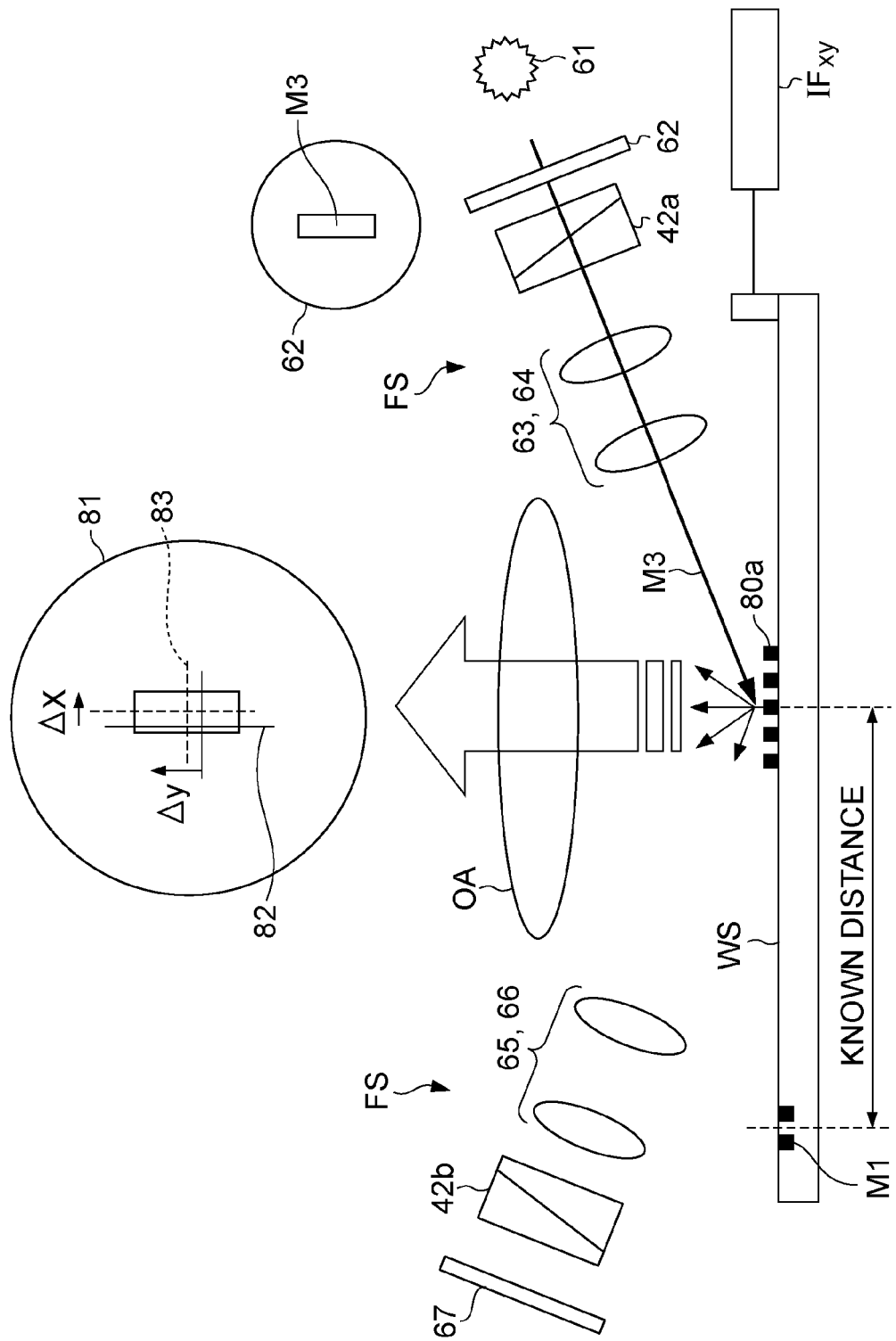
FIG. 11 is an explanatory view illustrating a method for measuring the position of an index mark in a modification of the fourth embodiment.
Figure 12:
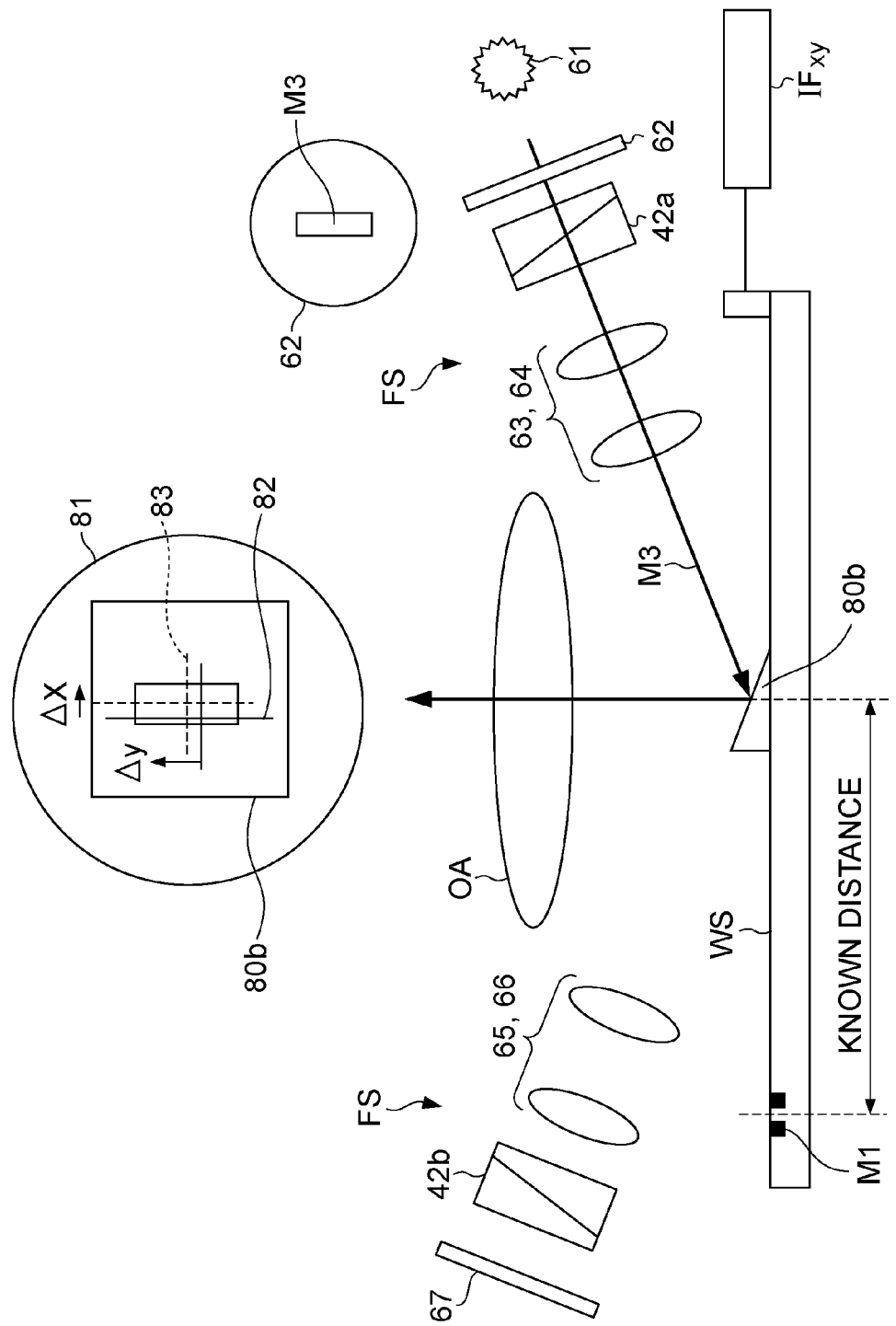
FIG. 12 is an explanatory view illustrating a method for measuring the position of an index mark in a modification of the fourth embodiment.
Figure 13:
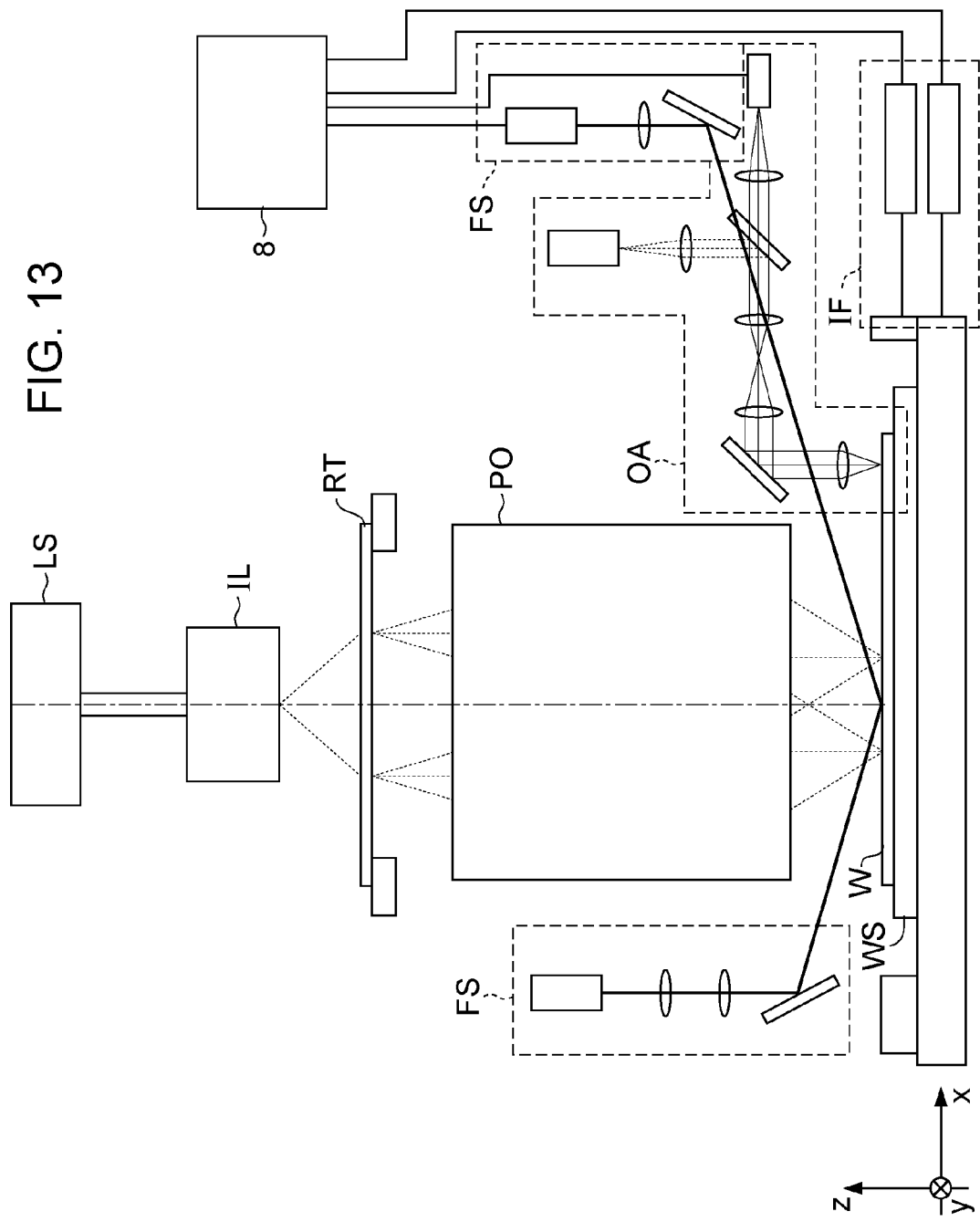
FIG. 13 is a structural view of an exposure apparatus of the related art.

The imaging position of the index mark M3 can be found from the result obtained in the fourth embodiment. For this reason, it is possible to project the index mark M3 onto the designed position, and to measure the height of the surface of the wafer W1 that is consistent with the position in the xy-direction of the alignment mark on the wafer W in a plane perpendicular to the optical axis of the projection optical system PO, which position is calculated by the alignment detection system OA. While the diffusing face 80 is provided on the wafer stage WS so as to observe the image of the index mark M3 in the fourth embodiment, a diffraction grating (reference portion) 80a may be provided on the wafer stage WS, as shown in FIG. 11. Alternatively, a reflecting face (reference portion) 80b having a slope such as to cause light from the index mark M3 to enter the alignment detection system OA may be provided on the wafer stage WS, as shown in FIG. 12.

A fifth embodiment of the present invention will now be described with reference to FIG. 10.

According to the fourth embodiment, chromatic aberration due to the wavelength can be measured.

Figure 10:
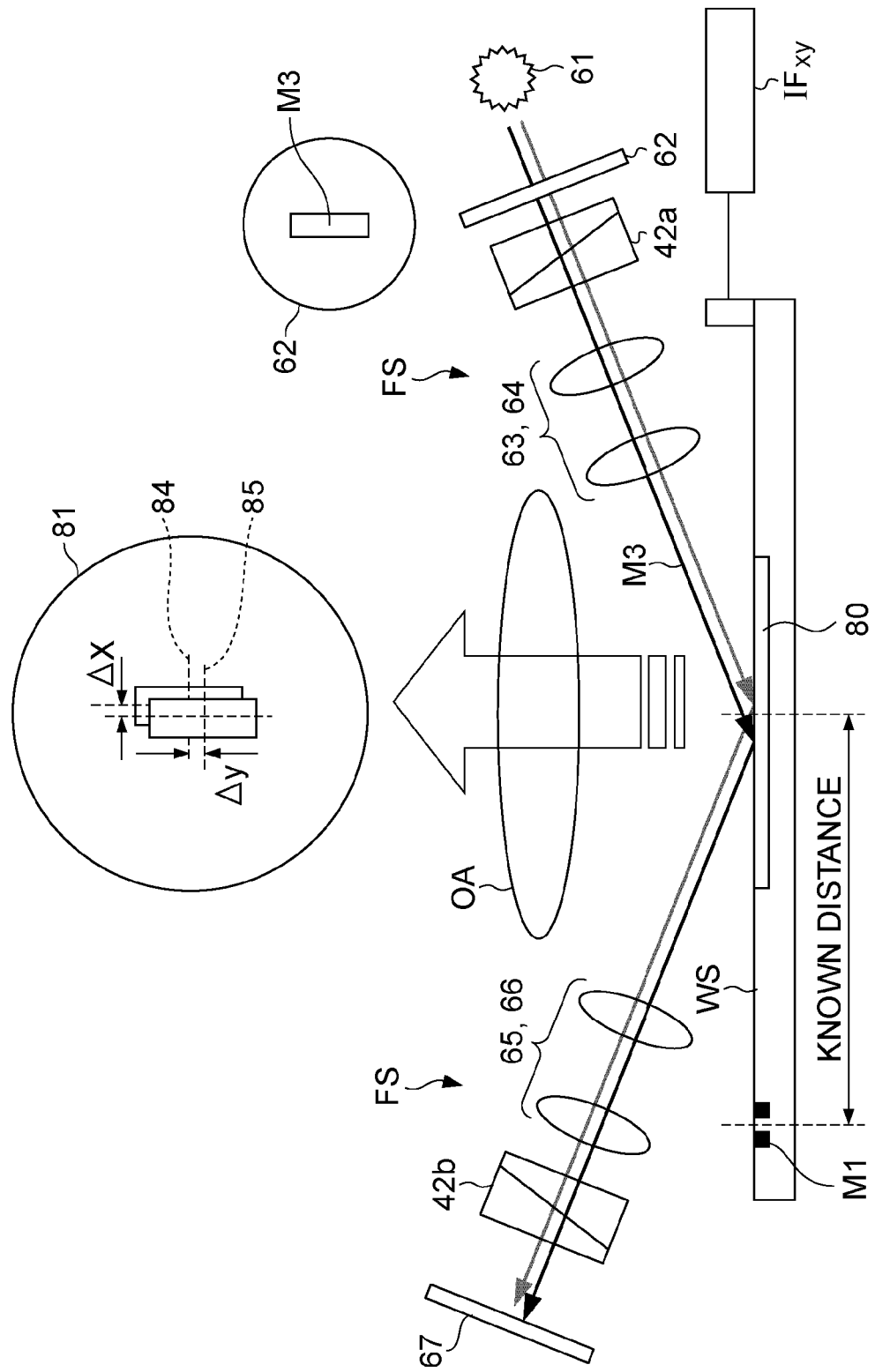
FIG. 10 is an explanatory view illustrating a method for measuring the position of an index mark in a fifth embodiment of the present invention.

FIG. 10 illustrates a measuring method using an exposure apparatus of the fifth embodiment. Optical members shown in FIG. 10 are denoted by reference numerals that are common to FIGS. 1 and 3. A detailed description of a technique common to the fourth embodiment shown in FIG. 9 will be omitted. A diffusing face 80 for diffusely reflecting light is provided on a wafer stage WS, and an index mark M3 is projected onto the diffusing face 80 by illumination wavelengths used in a focus detection system FS. By directly observing an image of the index mark M3 formed on the wafer stage WS with an alignment detection system OA, displacements in the x-, y-, and z-directions can be measured.

Two broken crosses 84 and 85 in an alignment observation field 81 shown in FIG. 10 indicate index marks M3 corresponding to different wavelengths. By minimizing the difference between the projected positions of the index marks M3, variations in the projected position of the index mark M3 due to the wavelength can be reduced. By being projected onto a position shifted by the difference from the measured position in the xy-direction, the index mark M3 can be projected onto the predetermined projected position. Alternatively, on the basis of the measurement result, the coordinates of the position in the xy-direction corresponding to the surface height of the wafer W measured by the focus detection system FS may be corrected to the original coordinates. Further alternatively, the projected position of the index mark M3 may be readjusted by adjusting the optical system and chromatic-aberration correcting optical members 42a and 42b.

The imaging position of the index mark M3 can be found from the result obtained in the fifth embodiment. For this reason, it is possible to project the index mark M3 onto the designed position, and to measure the height of the surface of the wafer W that is consistent with the position in the xy-direction of the alignment mark on the wafer W in a plane perpendicular to the optical axis of the projection optical system PO, which position is calculated by the alignment detection system OA.

While the off-axis alignment detection system is used as an example of an alignment detection system in the above-described embodiment, for example, the present invention is also applicable to a TTR or TTL alignment detection system.

Relative alignment may be performed with a TTL calibration detection system for measuring the base line amount. In this case, alignment is performed in two steps of measurement, that is, measurement of the relative position between the TTL calibration detection system and the alignment detection system OA and measurement of the relative position between the TTL calibration detection system and the projected position of the index mark M3 in the focus detection system FS.

A device is manufactured with the exposure apparatus according to any of the above-described embodiments through a step of exposing a substrate (e.g., a wafer or a glass plate) coated with a photosensitive material, a step of developing the substrate, and other known steps. The known steps include etching, resist stripping, dicing, bonding, and packaging.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-268000, filed Oct. 16, 2008, which is hereby incorporated by reference herein in its entirety.

What is claimed is:

1. An apparatus comprising:
   a stage configured to move a substrate;
   an optical system configured to project an image of a pattern on an original onto the substrate;
   an alignment detection system configured to detect an image of an alignment mark formed on the substrate and measure a position of the alignment mark; and
   a focus detection system configured to measure a height of the substrate by projecting an image of an index mark onto the substrate,
   wherein the stage includes an alignment measurement mark and a focus measurement mark that has a positional relationship with the alignment measurement mark,
   wherein the alignment detection system measures a position of the alignment measurement mark,
   wherein the focus detection system measures a position of the image of the index mark by projecting the image of the index mark onto the focus measurement mark, and
   wherein a difference of the position of the image of the index mark from a designed value is corrected by switching a wavelength of detection light used in the focus detection system.

2. The apparatus according to claim 1,
   wherein the focus measurement mark includes a portion having a high reflectance and a portion having a low reflectance.

3. The apparatus according to claim 2,
   wherein the focus detection system measures the position of the image of the index mark based on a light intensity of the image of the index mark reflected by the focus measurement mark.

4. The apparatus according to claim 1,
   wherein the alignment detection system is provided outside an optical axis of the optical system.

5. An apparatus, comprising:
   a stage having a reference portion configured to move a substrate;
   a projection optical system configured to project an image of a pattern on an original onto the substrate;
   an alignment detection system configured to detect an image of an alignment mark formed on the substrate and measure a position of the alignment mark; and
   a focus detection system configured to measure a height of the substrate by projecting an image of an index mark onto the substrate,
   wherein the alignment detection system measures a position of the image of the index mark by detecting the image of the index mark projected onto the reference portion, and
   wherein a difference of the position of the image of the index mark from a designed value is corrected by switching a wavelength of detection light used in the focus detection system.

6. The apparatus according to claim 5,
   wherein the focus measurement mark includes a portion having a high reflectance and a portion having a low reflectance.

7. The apparatus according to claim 6,
   wherein the focus detection system measures the position of the image of the index mark based on a light intensity of the image of the index mark reflected by the focus measurement mark.

8. The apparatus according to claim 5,
   wherein the alignment detection system is provided outside an optical axis of the optical system.

9. The apparatus according to claim 5,
   wherein the focus detection system projects the image of the index mark in an observation field of the alignment detection system.

10. The apparatus according to claim 5,
    wherein the reference portion includes a diffusing face.

11. The apparatus according to claim 5,
    wherein the reference portion includes a diffraction grating.

12. The apparatus according to claim 5,
    wherein the reference portion includes a reflecting face having a slope.

* * * * *